(12) United States Patent
Jung et al.

(10) Patent No.: US 8,785,932 B2
(45) Date of Patent: Jul. 22, 2014

(54) IR SENSING TRANSISTOR AND MANUFACTURING METHOD OF DISPLAY DEVICE INCLUDING THE SAME

(75) Inventors: Suk Won Jung, Goyang-si (KR); Byeong Hoon Cho, Seoul (KR); Sung Hoon Yang, Seoul (KR); Woong Kwon Kim, Cheonan-si (KR); Sang Youn Han, Seoul (KR); Dae Cheol Kim, Hwaseong-si (KR); Ki-Hun Jeong, Cheongan-si (KR); Kyung-Sook Jeon, Yongin-si (KR); Seung Mi Seo, Seoul (KR); Jung-Suk Bang, Guri-si (KR); Kun-Wook Han, Seongnam-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/182,235

(22) Filed: Jul. 13, 2011

(65) Prior Publication Data

US 2012/0138929 A1    Jun. 7, 2012

(30) Foreign Application Priority Data

Dec. 1, 2010    (KR) .......................... 10-2010-0121645

(51) Int. Cl.
*H01L 33/50*    (2010.01)
(52) U.S. Cl.
USPC .................. 257/55; 257/53; 257/66; 257/290
(58) Field of Classification Search
USPC .................... 257/55, 53, 66, E33.06, E29.273
See application file for complete search history.

(56) References Cited

U.S. PATENT DOCUMENTS

| 4,598,305 | A | * | 7/1986 | Chiang et al. | 257/66 |
| 4,723,838 | A | * | 2/1988 | Aoki et al. | 349/47 |
| 5,084,777 | A | * | 1/1992 | Slobodin | 349/27 |
| 5,640,260 | A | * | 6/1997 | Sumida | 349/26 |
| 5,760,853 | A | * | 6/1998 | Yamashita | 349/30 |
| 6,278,229 | B1 | * | 8/2001 | Moradi et al. | 313/309 |
| 6,738,031 | B2 | | 5/2004 | Young et al. | |
| 6,791,144 | B1 | | 9/2004 | Fryer et al. | |
| 7,161,185 | B2 | * | 1/2007 | Yamazaki et al. | 257/88 |
| 7,414,267 | B2 | * | 8/2008 | Yamazaki et al. | 257/72 |
| 7,521,737 | B2 | * | 4/2009 | Augusto | 257/233 |
| 7,648,861 | B2 | * | 1/2010 | Yamazaki et al. | 438/149 |
| 7,816,866 | B2 | * | 10/2010 | Nakajima et al. | 313/542 |
| 7,986,021 | B2 | * | 7/2011 | Okada et al. | 257/436 |
| 2006/0189047 | A1 | * | 8/2006 | Yamazaki et al. | 438/149 |
| 2009/0057670 | A1 | * | 3/2009 | Yamazaki et al. | 257/59 |

(Continued)

FOREIGN PATENT DOCUMENTS

| JP | 08-122816 A | 5/1996 |
| JP | 08-167719 A | 6/1996 |

(Continued)

*Primary Examiner* — Julio J Maldonado
*Assistant Examiner* — Jaehwan Oh
(74) *Attorney, Agent, or Firm* — Innovation Counsel LLP

(57) ABSTRACT

An IR sensing transistor according to an exemplary embodiment of the present invention includes: a light blocking layer formed on a substrate; a gate insulating layer formed on the light blocking layer; a semiconductor formed on the gate insulating layer; a pair of ohmic contact members formed on the semiconductor; a source electrode and a drain electrode formed on respective ones of the ohmic contact members; a passivation layer formed on the source electrode and the drain electrode; and a gate electrode formed on the passivation layer, wherein substantially all of the gate insulating layer lies on the light blocking layer.

12 Claims, 13 Drawing Sheets

(56) References Cited

U.S. PATENT DOCUMENTS

| | | | |
|---|---|---|---|
| 2010/0244133 A1* | 9/2010 | Kamath et al. | 257/347 |
| 2011/0006302 A1* | 1/2011 | Yamazaki et al. | 257/43 |
| 2011/0031496 A1* | 2/2011 | Yamazaki et al. | 257/59 |
| 2011/0057187 A1* | 3/2011 | Sakakura et al. | 257/43 |
| 2011/0058116 A1* | 3/2011 | Yamazaki et al. | 349/43 |
| 2011/0096021 A1* | 4/2011 | Kim et al. | 345/174 |
| 2011/0175100 A1* | 7/2011 | Tsuji et al. | 257/66 |
| 2011/0210324 A1* | 9/2011 | Sakakura et al. | 257/43 |
| 2012/0138929 A1* | 6/2012 | Jung et al. | 257/55 |

FOREIGN PATENT DOCUMENTS

| | | |
|---|---|---|
| JP | 2005-033009 A | 2/2005 |
| JP | 2006-323199 A | 11/2006 |
| JP | 2008-287061 A | 11/2008 |
| JP | 2009-099977 A | 5/2009 |
| KR | 1020070002280 A | 5/2007 |
| KR | 1020090098190 A | 9/2009 |

* cited by examiner

IR SENSING TRANSISTOR AND MANUFACTURING METHOD OF DISPLAY DEVICE INCLUDING THE SAME

CROSS-REFERENCE TO RELATED APPLICATION

This application claims priority to, and the benefit of, Korean Patent Application No. 10-2010-0121645 filed in the Korean Intellectual Property Office on Dec. 1, 2010, the entire contents of which are incorporated herein by reference.

BACKGROUND OF THE INVENTION (a) Field of the Invention

Embodiments of the present invention relate generally to touch screens. More specifically, embodiments of the present invention relate to IR sensing transistors and their manufacture.

(b) Description of the Related Art

In recent years, various types of flat panel displays have been developed and used. One such type of display, the liquid crystal display, has found wide acceptance for many purposes.

Some recent efforts have focused on research into, and development of, liquid crystal displays having a touch sensing function, or an image sensing function. In order to implement the touch sensing function and the image sensing function, both an IR sensing transistor and a visible-ray sensing transistor are typically employed. Continuing efforts exist to improve and refine these sensors.

The above information disclosed in this Background section is only for enhancement of understanding of the background of the invention. Therefore, it may contain information not in the prior art.

SUMMARY OF THE INVENTION

Typically, an IR sensing transistor and a visible-ray sensing transistor are different in certain characteristics, and thus require different processes for their formation. The overall process of forming panels including both IR and visible-ray sensing transistors is thus somewhat complicated.

Typically, the readout transistor and the IR sensing transistor use one insulation layer as a gate insulating layer. However, since the semiconductor characteristics of the readout transistor and the IR sensing transistor are different from each other, semiconductors of the readout transistor and the IR sensing transistor are often manufactured by different processes. Therefore, the surface of the gate insulating layer on which the semiconductor of the IR sensing transistor is formed may be exposed to another process, and damaged while the semiconductor of the readout transistor is formed. This results in deterioration of interface characteristics of the IR sensing transistor, thus also resulting in deterioration in electrical characteristics of the IR sensing transistor.

Embodiments of the present invention have been made in an effort to provide an IR sensing transistor and a manufacturing method of a display device that can improve electrical characteristics of the IR sensing transistor while simplifying a process of forming a visible-ray sensing transistor.

An exemplary embodiment of the present invention provides an IR sensing transistor including: a light blocking layer formed on a substrate; a gate insulating layer formed on the light blocking layer; a semiconductor formed on the gate insulating layer; a pair of ohmic contact members formed on the semiconductor; a source electrode and a drain electrode formed on respective ones of the ohmic contact members; a passivation layer formed on the source electrode and the drain electrode; and a gate electrode formed on the passivation layer, wherein substantially all of the gate insulating layer lies on the light blocking layer. Additional embodiments include configurations in which the gate insulating layer and light blocking layer have substantially the same plane pattern.

The source electrode and the drain electrode may be positioned within an outer edge of the light blocking layer.

The source electrode and the drain electrode both at least partially overlap the gate electrode, and at least two source electrodes are disposed in alternating manner with at least two drain electrodes.

The gate electrode and the light blocking layer may be connected through contact holes formed in the passivation layer and the gate insulating layer.

The semiconductor may be made of amorphous silicon, microcrystalline silicon, amorphous silicon germanium, or amorphous germanium.

The light blocking layer may be made of amorphous germanium or amorphous silicon germanium.

The IR sensing transistor may further include: a conductive layer positioned on the light blocking layer; and a lower gate electrode positioned on the conductive layer.

The conductive layer may include at least one of titanium, molybdenum, a titanium compound, and a molybdenum compound.

The conductive layer may have a thickness in the range of about 50 to about 100 Å.

The IR sensing transistor may further include a lower gate electrode positioned on the light blocking layer and conductive impurities may be doped into the light blocking layer.

The thickness of the layer doped with the conductive impurities may be about 300 Å or more, and the conductive impurities may include phosphorus.

Another exemplary embodiment of the present invention provides a manufacturing method of a display device, the method including: forming a gate electrode of a readout transistor on a substrate; forming a first insulating layer on the gate electrode of the readout transistor; forming a semiconductor of the readout transistor, a first ohmic contact pattern, and an anti-etching pattern on the first insulating layer; laminating a blocking layer, a second insulating layer, a first silicon layer, and a second silicon layer on the anti-etching pattern and the first insulating layer; forming a photosensitive layer pattern on the second silicon layer, the photosensitive layer pattern having a first part and a second part thicker than the first part; forming a second ohmic contact pattern, a semiconductor of an IR sensing transistor, a gate insulating layer, and a light blocking layer by etching the second silicon layer, the first silicon layer, the second insulating layer, and the blocking layer respectively, using the photosensitive pattern as a mask; and removing the first part of the photosensitive layer pattern and, thereafter, etching the second silicon pattern and the first silicon pattern using the second part as a mask; removing the photosensitive layer pattern; forming a source electrode and a drain electrode of the readout transistor and a source electrode and a drain electrode of the IR sensing transistor by forming and patterning a metal layer on the substrate; forming an ohmic contact member by etching the first ohmic contact pattern and the second ohmic contact pattern using the source electrode and the drain electrode as the mask; forming a passivation layer to cover the semiconductor between the source electrode and the drain electrode; and forming a gate electrode of the IR sensing transistor and an upper gate electrode on the passivation layer, wherein the gate electrode of the IR sensing transistor is connected with the light blocking layer, and the upper gate electrode is connected to the gate electrode of the readout transistor.

The method may further include forming a connection member on the passivation layer, the connection member connecting the drain electrode of the readout transistor and the source electrode of the IR sensing transistor.

The method may further include doping conductive impurities into the light blocking layer after the forming of the light blocking layer.

The conductive impurities may include phosphorus.

The laminating may further include forming a conductive layer on the blocking layer.

The conductive layer may include at least one of titanium, molybdenum, a titanium compound, and a molybdenum compound.

The conductive layer may have a thickness in the range of about 50 to about 100 Å.

The first silicon layer may comprise amorphous silicon, microcrystalline silicon, amorphous silicon germanium, or amorphous germanium.

The blocking layer may comprise amorphous germanium or amorphous silicon germanium.

The method may further include removing the anti-etching pattern after the removing of the photosensitive layer pattern.

According to exemplary embodiments of the present invention, when a light blocking layer, an insulating layer, a semiconductor, and an ohmic contact member are substantially simultaneously formed, it is possible to simplify a process for forming each layer.

Further, since the surface of a gate insulating layer of the IR sensing transistor is not exposed to an external process, it is possible to maintain desirable interface characteristics of the IR sensing transistor.

DETAILED DESCRIPTION OF THE EMBODIMENTS

Figure 1:
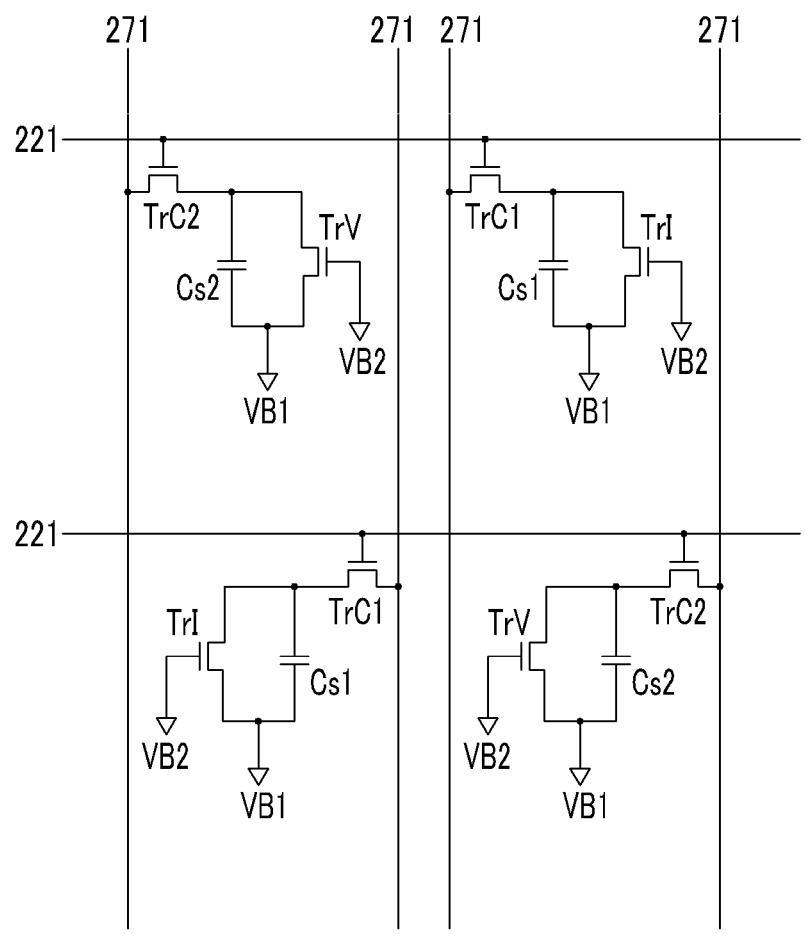
FIG. 1 is a schematic circuit diagram of a touch panel according to an exemplary embodiment of the present invention.

Hereinafter, a display device will be described with reference to the accompanying drawings. Herein, i) shapes, sizes, ratios, angles, numbers, operations, etc. shown in the accompanying drawings are schematic and may partially be modified. ii) Since the drawings are illustrated by observer's eyes, a direction or a position used to illustrate the drawings may variously be changed depending on the position of the observer. iii) Although reference numerals are different, like elements refer to like reference numerals. iv) When 'include', 'have', 'constituted by', etc. are used, another part may be added as long as 'only~' is not used. v) When an element is described as the singular, it may be interpreted as the plural number. vi) Although numerical values, shapes, the comparison of sizes, a positional relationship, etc. are not described by 'approximately', 'substantially', etc., they are interpreted to include a typical error range. vii) Although terms such as 'after~', 'before~', 'continually', 'in addition', 'herein', 'subsequently', etc. are used, they are not used as a meaning defining a temporal position. viii) Terms such as 'first', 'second', etc. are selectively, replaceably, or repetitively for convenience of simple classification and are not interpreted as a limited meaning. ix) When the positional relationship between two parts is described by 'on~', 'above~', 'beneath', 'below~', 'beside~', 'at the side', etc., one or more other parts may be interposed between the two parts as long as 'just' is not used. x) When the parts are connected with each other by 'or~', the parts are interpreted singly or to include even a combination thereof, but when they are connected with each other by 'or~ and one of~', they are interpreted only singly.

Hereinafter, a touch panel according to an exemplary embodiment of the present invention will be described with reference to FIGS. 1 and 2.

FIG. 1 is a schematic circuit diagram of a touch panel according to an exemplary embodiment of the present invention.

Figure 2:
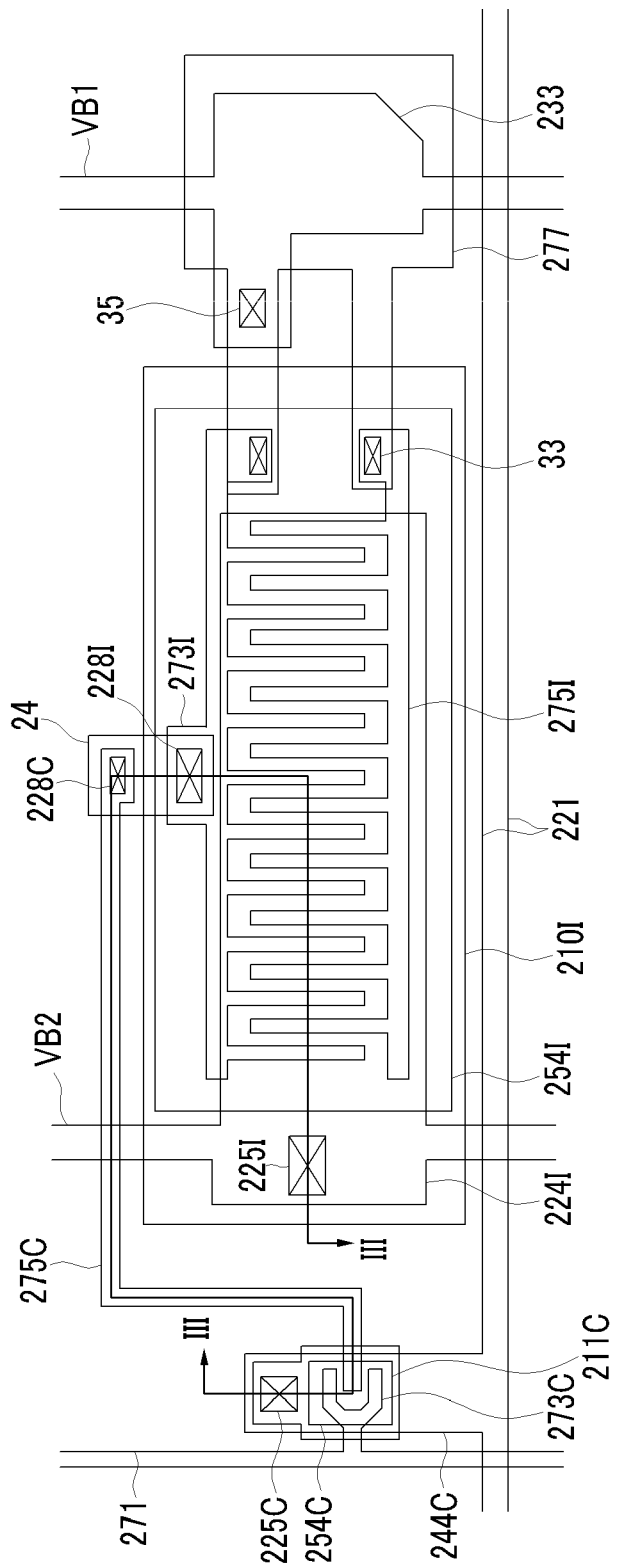
FIG. 2 is a layout view of an IR sensing transistor and a readout transistor which forms a pair with the IR sensing transistor of a touch panel according to an exemplary embodiment of the present invention.

Referring to FIGS. 1 and 2, first signal lines 271 and second signal lines 221 are disposed on a substrate. The first signal lines 271 are connected to a readout driving circuit, and the second signal lines 221 cross the first signal lines 271. In addition, readout transistors TrC1 and TrC2 are each connected to both a first signal line 271 and a second signal line 221.

The readout transistors TrC1 and TrC2 are connected with an IR sensing transistor TrI or a visible-ray sensing transistor TrV with storage capacitors Cs1 and Cs2 threbetween, respectively. The IR sensing transistor TrI and the visible-ray sensing transistor TrV may be substantially uniformly distributed on an upper display panel so as to sense infrared rays and visible rays in all relevant parts of a display panel, and may generally form a matrix as shown in FIG. 1. For example, the IR sensing transistor TrI and the visible-ray sensing transistor TrV may be alternately arranged, may be arranged at any predetermined ratio, or may be arranged in any other manner, including randomly or without a particular order.

When infrared rays are incident on the IR sensing transistor TrI of the display device, a voltage of the capacitor Cs1 varies in association with a third signal line VB1 by a generated optical current, and when a gate signal is applied to the second signal line 221, the readout transistor TrC1 actuates to charge the capacitor Cs1 with a data voltage transferred to the first signal line 271. In this case, a gate signal for actuating the IR sensing transistor TrI is applied to a fourth signal line VB2.

As such, when a readout transistor TrC1 of a pixel in which the capacitor Cs1 is charged is found and an X coordinate and a Y coordinate of the readout transistor TrC1 are detected, a sensing location may be found.

Hereinafter, the IR sensing transistor and the readout transistor of the touch panel display device will be described in further detail with reference to FIGS. 2 and 3.

Figure 3:
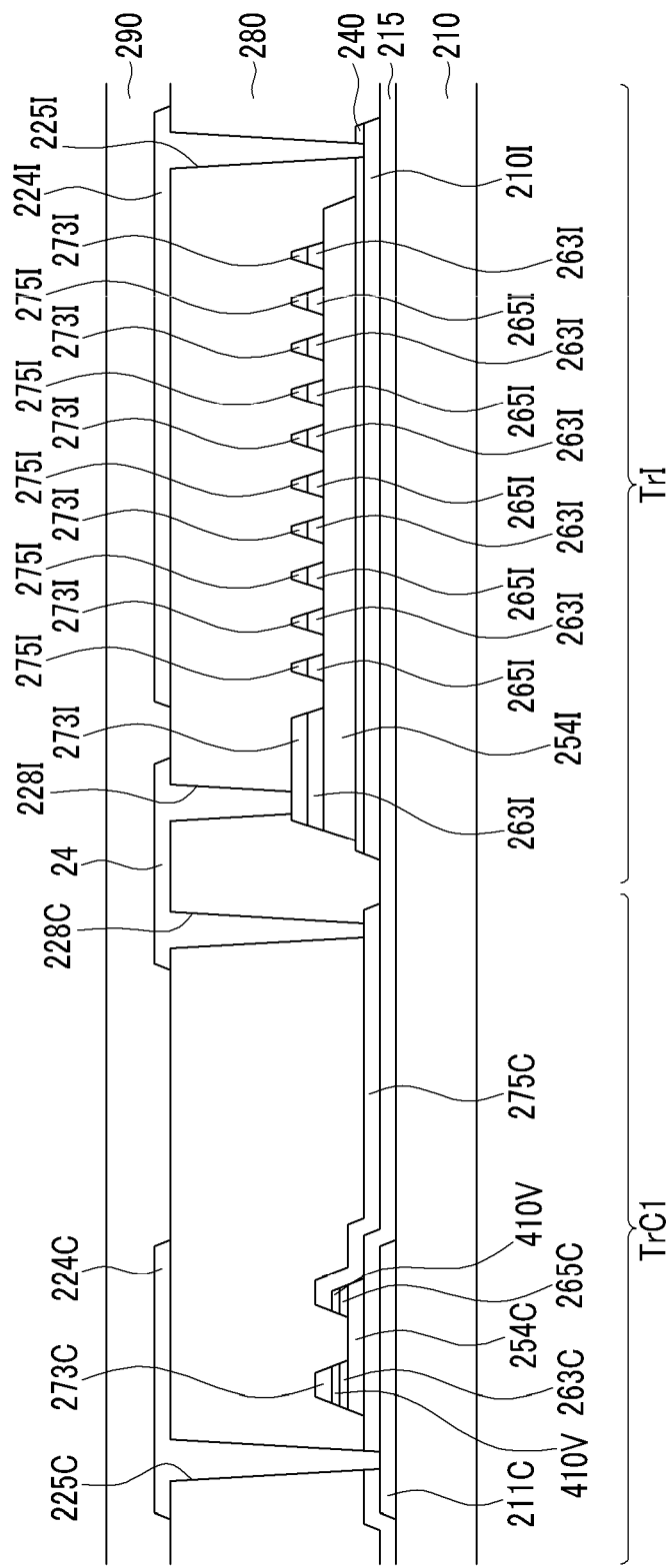
FIG. 3 is a cross-sectional view taken along line II-II of FIG. 2.

FIG. 2 is a layout view of an IR sensing transistor and readout transistor pair of a touch panel according to an exemplary embodiment of the present invention, and FIG. 3 is a cross-sectional view taken along line II-II of FIG. 2.

As shown in FIGS. 2 and 3, a lower gate electrode 211C of the readout transistor TrC1 is positioned on a substrate 210 made of transparent glass or plastic. The lower gate electrode 211C may be made of molybdenum, aluminum, or the like, and may be formed of multiple layers, such as molybdenum/aluminum or molybdenum/aluminum/molybdenum layers. The lower gate electrode 211C prevents a light leakage current from being generated by the semiconductor's reaction to external light.

A blocking insulation layer 215, including an insulation material such as silicon nitride, is formed on the lower gate electrode 211C. The thickness of the blocking insulation layer 215 is preferably in the range of about 3000 to about 10000 Å.

When the thickness of the blocking insulation layer 215 is equal to or less than about 3000 Å, since infrared sensing largely varies in accordance with a variation in Vgs, a characteristic curve of the IR sensing transistor rapidly varies. Conversely, when the thickness of the blocking insulation layer 215 is equal to or more than 10000 Å, the transistor cannot be sufficiently miniaturized.

The blocking insulation layer 215 also acts as a gate insulating layer of the readout transistor TrC1.

In addition, a semiconductor 254C and a light blocking layer 210I of the readout transistor TrC1 are positioned on the blocking insulation layer 215.

The semiconductor 254C is made of amorphous silicon. Ohmic contact members 263C and 265C face each other while forming a pair on the semiconductor 254C, and may be made of the same material as an ohmic contact member of the IR sensing transistor.

An anti-etching layer 410V is formed on ohmic contact layers 263C and 265C.

The anti-etching layer 410V is formed to prevent the semiconductor 254C of the readout transistor TrC1 from being damaged at the time of forming a semiconductor 254I of the IR sensing transistor TrI, and may include materials selected from Mo, Cr, MoAlMo, MOAl, IZO, and ITO. Alternatively, the anti-etching layer 410V may be removed.

A source electrode 273C and a drain electrode 275C are positioned on the anti-etching layer 410V. The source electrode 273C and the drain electrode 275C may be made of the same material as the lower gate electrode 211C, or be made of a low-resistance metal such as copper, or the like.

Meanwhile, the light blocking layer 210I may include a material that blocks visible rays provided from the outside of the liquid crystal display and passes only infrared rays. For example, the light blocking layer 210I may include an organic material including a black pigment, amorphous silicon, amorphous silicon germanium, or amorphous germanium.

The light blocking layer 210I improves a signal to noise ratio (SNR) by blocking the visible rays incident to the liquid crystal display from external sources, thus improving the sensitivity of the semiconductor 254I.

In addition, an insulation layer 240, made of an insulation material such as silicon nitride, is formed on the light blocking layer 210I. The insulation layer 240 has generally the same plane pattern as the light blocking layer 210I, i.e. substantially all of the insulation layer 240 lies on the light blocking layer 210I, or the insulation layer 240 substantially completely overlaps the light blocking layer 210I. In this case, the insulation layer 240 becomes a gate insulating layer of the IR sensing transistor TrI.

The semiconductor 254I of the IR sensing transistor TrI is formed on the insulation layer 240. The semiconductor 254I is positioned generally within an outer edge of the light blocking layer 210I.

The semiconductor 254I may include amorphous silicon, microcrystalline silicon, amorphous silicon germanium, or amorphous germanium, and may be formed as a single layer or double layer structure, e.g., a double layer such as a lower layer made of amorphous silicon and an upper layer made of amorphous silicon germanium. When the semiconductor 254I is formed as a double layer, the semiconductor 254I may be formed by combining a material having a fast deposition speed and a material having a slow deposition speed and good channel characteristics with each other.

The semiconductor 254I includes N-type conductive impurities such as P and As.

Ohmic contact members 263I and 265I are positioned to face each other over the semiconductor 254I. The ohmic contact members 263I and 265I may be made of a material such as n+hydrogenated amorphous silicon doped with n type impurities such as high-concentration phosphorus or silicide.

The source electrode 273I and the drain electrode 275I are positioned on the ohmic contact members 263I and the 265I, respectively. The source electrode 273I and the drain electrode 275I may be made of the same material as a source electrode and a drain electrode of the readout transistor TrC1.

Each of the source electrode 273I and the drain electrode 275I has a horizontal stem portion, and may have a plurality of branches extending from the horizontal stem portion. The branch of the source electrode 273I and the branch of the drain electrode 275I are alternately arranged, with interlocking fingerlike protrusions.

A passivation layer 280 is formed on the source electrode 273C and the drain electrode 275C of the readout transistor TrC1, and the source electrode 273I and the drain electrode 275I of the IR sensing transistor TrI. The passivation layer 280 helps protect the channel region between source and drain electrodes of the transistors TrC1 and TrI.

The passivation layer 280 includes a contact hole 228C for exposing the drain electrode 275C of the readout transistor TrC1, and a contact hole 228I for exposing the source electrode 273I of the IR sensing transistor TrI. In addition, a contact hole 225I is formed on the passivation layer 280 for exposing the light blocking layer 210I and the insulation layer 240, and a contact hole 225C is formed on the passivation layer 280 for exposing the lower gate electrode 211C and the blocking insulation layer 215.

An upper gate electrode 224C of the readout transistor TrC1, a gate electrode 224I, and a connection member 24 of the IR sensing transistor TrI are positioned on the passivation layer 280.

The upper gate electrode 224C prevents the semiconductor 254C from being exposed to external light, and is connected with the lower gate electrode 211C through the contact hole 225C.

In particular, the gate electrode 224I overlaps the semiconductor 254I to prevent external visible rays from being transferred to the semiconductor 254I. Accordingly, it is possible to prevent sensing characteristics from being deteriorated due to external visible rays.

The gate electrode 224I is connected with the light blocking layer 210I through the contact hole 225I. When the light blocking layer 210I is made of a semiconductor material, the light blocking layer 210I may generate microcharges by absorbing external light, thus influencing an operation of the transistor. However, this effect may be reduced by connecting the light blocking layer 210I with the gate electrode 224I to apply a gate voltage having a predetermined magnitude to the light blocking layer 210I.

In addition, the connection member 24 allows the drain electrode 275C of the readout transistor TrC1 and the source electrode 273I of the IR sensing transistor TrI to be connected with each other through the contact holes 228C and 288I.

An insulation layer 290 for protecting the upper gate electrode 224C and the gate electrode 224I may be formed on the upper gate electrode 224C and the gate electrode 224I.

As described in the above exemplary embodiment, when the source electrode 273I and the drain electrode 275I are formed within a boundary of the semiconductor 254I, neither the source electrode 273I nor the drain electrode 275I contain any discontinuities due to a step difference in height generated by the thickness of the semiconductor 254I.

Storage electrode 233 is an electrode of the storage capacitor, and conductor 277 is a conductor for the storage capacitor. The storage electrode 233 forms a storage capacitance with the conductor 277 for the storage capacitor, with the passivation layer interposed therebetween. The conductor 277 is connected with the source electrode 273I and the drain electrode 275I of the IR sensing transistor through a contact hole 33.

Next, the visible-ray transistor and the readout transistor TrC2 will be described in further detail with reference to FIG. 4.

Figure 4:
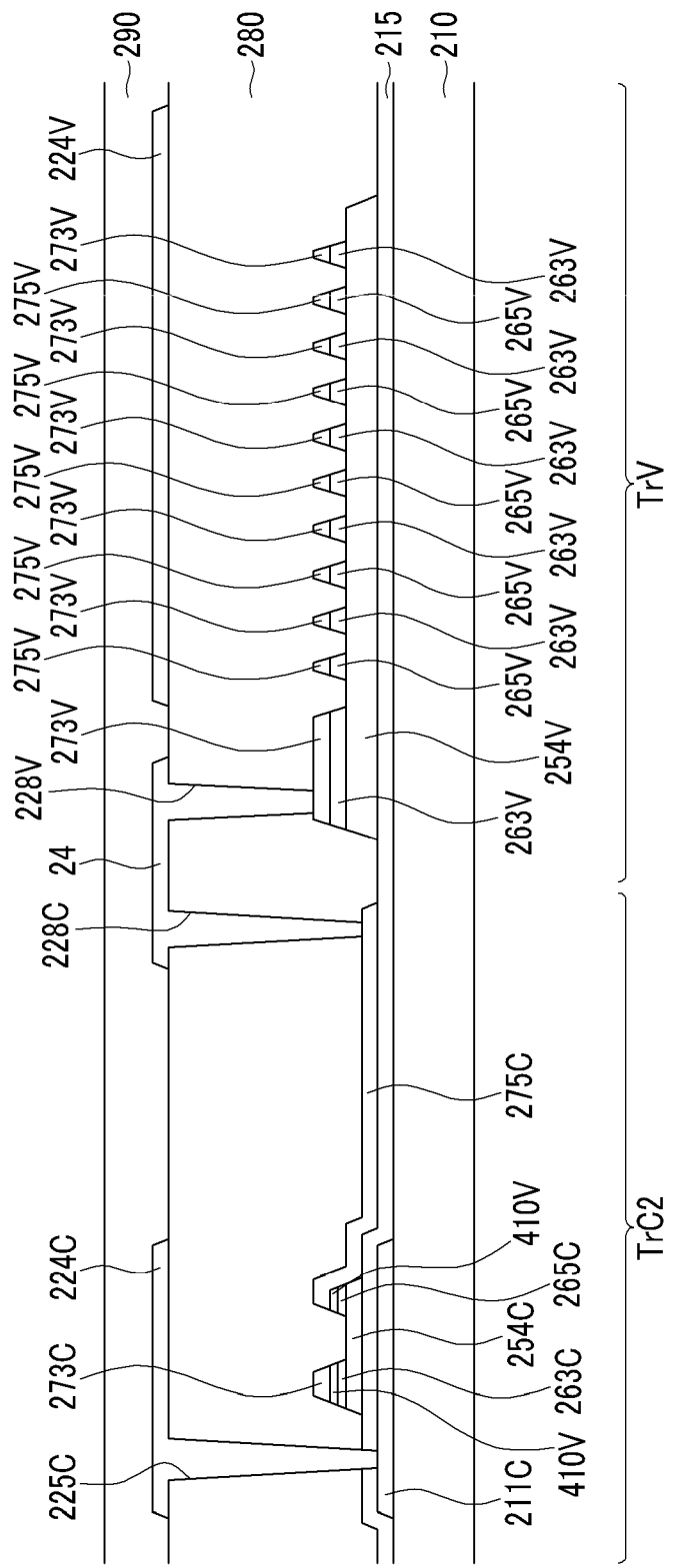
FIG. 4 is a cross-sectional view of a visible-ray transistor and a readout transistor.

FIG. 4 is a cross-sectional view of a visible-ray transistor and a readout transistor.

As shown in FIG. 4, the readout transistor TrC2 and the visible-ray transistor TrV have substantially the same interlayer structure as the readout transistor TrC1 and IR sensing transistor TrI.

First, the readout transistor TrC2 may include the semiconductor 254C, the ohmic contact members 263C and 265C, the source electrode 273C, the drain electrode 275C, the insulation layer 240, the upper gate electrode 224C, and the lower gate electrode 211C.

In addition, the visible-ray sensing transistor TrV may include the semiconductor 254V, the ohmic contact members 263V and 265V, the source electrode 273V, the drain electrode 275V, the insulation layer 240, and the gate electrode 224V.

In detail, the semiconductors 254C and 254V are made of amorphous silicon, and are positioned on the blocking insulation layer 215.

In addition, the ohmic contact members 263V, 263C, 265V, and 265C face each other on the semiconductors 254C and 254V. The source electrodes 273V and 273C and the drain electrodes 275V and 275C are positioned on the ohmic contact members 263V, 263C, 265V, and 265C respectively. An anti-etching layer (not shown) may be formed between the ohmic contact members and the source and drain electrodes. The anti-etching layer may be formed in order to prevent the semiconductor 254V of the visible-ray sensing transistor TrV from being damaged during formation of the semiconductor 254I of the IR sensing transistor TrI.

The passivation layer 280 covers the source electrode 273V and the drain electrode 275V. The gate electrodes 224C and 224V are positioned on the passivation layer 280 to correspond to the channels of the visible-ray sensing transistor and the readout transistor, respectively.

In addition, the readout transistor TrC2 includes the lower gate electrode 211C like the readout transistor TrC1 of an IR pixel, and is connected with the upper gate electrode 224C through the contact hole 225C.

However, the visible-ray transistor TrV reacts to the visible rays and thus does not include the light blocking layer 210I, unlike the IR transistor TrI.

The touch panel may be attached to a panel for the liquid crystal display, in order to form a display device.

Figure 5:
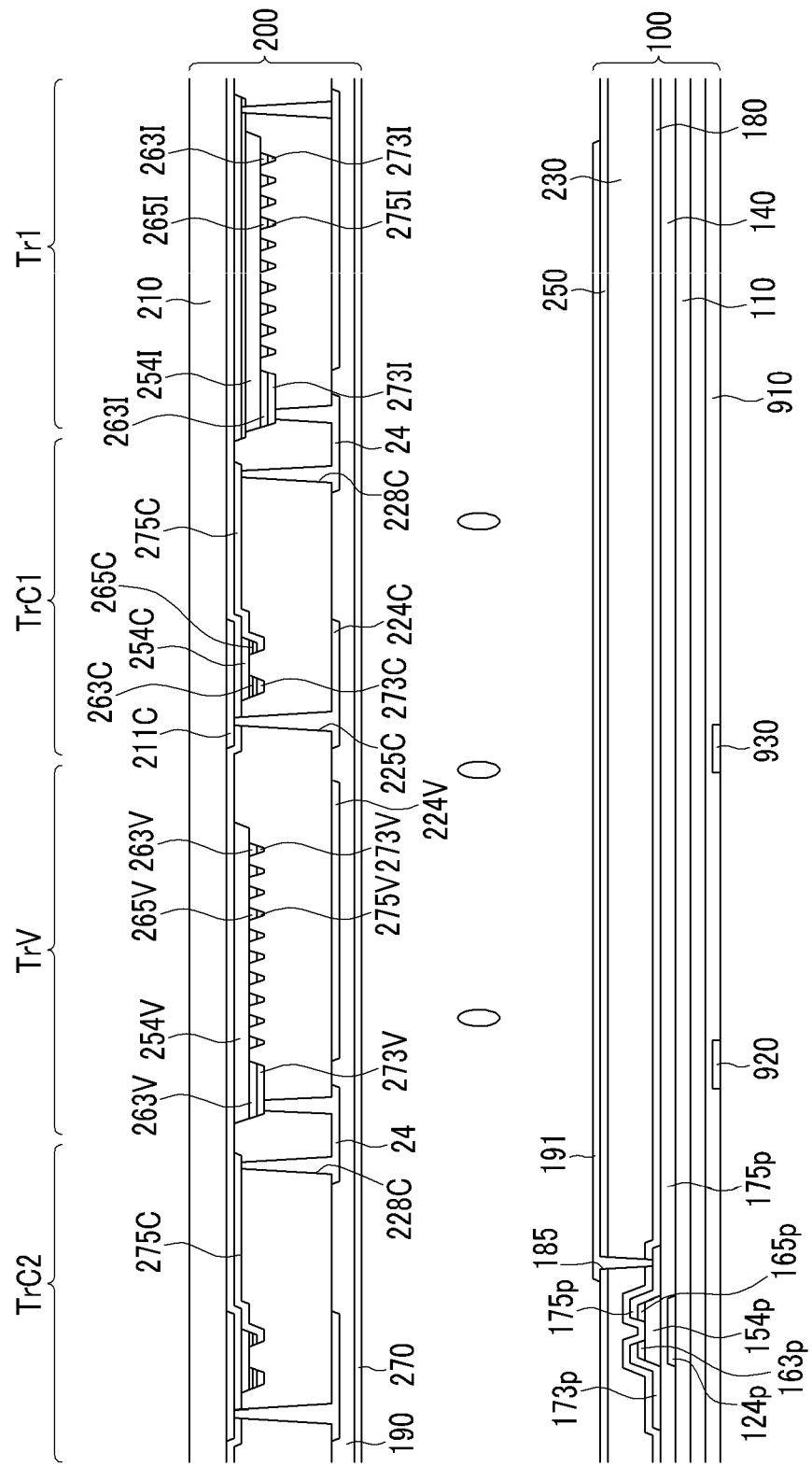
FIG. 5 is a cross-sectional view of a display device including a touch panel according to an exemplary embodiment of the present invention.

FIG. 5 is a cross-sectional view of a display device including a touch panel according to an exemplary embodiment of the present invention. Referring to FIG. 5, the display device includes an upper display panel 200 including the touch panel, and a lower display panel 100 including a pixel electrode. The panels 100, 200 face each other and a liquid crystal layer 3 is interposed between them.

The liquid crystal layer 3 has negative dielectric anisotropy, and liquid crystal molecules of the liquid crystal layer 3 may be aligned such that their long axes are substantially perpendicular to the surfaces of both display panels while no electric field is present.

Alignment layers (not shown) may be formed on the inner surface of the display panels 100 and 200, and may be perpendicular alignment layers.

The display device may further include a lower polarizer (not shown) positioned below the lower display panel 100, and an upper polarizer (not shown) positioned above the upper display panel 200. It is possible to adjust the intensity of light provided to the lower display panel 100 and the upper display panel 200 by using polarization properties of the lower polarizer and the upper polarizer, as is known.

The display device may further include a backlight unit 910 positioned below the lower display panel 100. The backlight unit 910 may include at least one IR luminous body 920 and at least one visible-ray luminous body 930. The IR luminous body 920 and the visible-ray luminous body 930 may be point light sources, such as light emitting devices (LEDs). In addition, infrared rays and visible rays that are emitted from the IR luminous body 920 and the visible-ray luminous body 930, respectively may be incident substantially perpendicular to the lower display panel 100.

Multiple IR luminous bodies 920 and visible-ray luminous bodies 930 may be present, and may be substantially uniformly distributed throughout the backlight unit 910 to provide infrared rays and visible rays to the backlight unit 910. For example, the IR luminous body 920 and the visible-ray luminous body 930 may be alternately arranged, may be arranged at any predetermined ratio, or may be arranged in any other manner, including randomly or without a particular order.

The lower display panel 100 includes a lower substrate 110 made of transparent glass or plastic, and a pixel transistor TrP formed on the lower substrate 110. The pixel transistor TrP may include a gate electrode 124p formed on the lower substrate 110, a gate insulating layer 140 covering the lower substrate 110 and the gate electrode 124p, a semiconductor layer 154p overlapped with the gate electrode 124p on the gate insulating layer 140, ohmic contact layers 163p and 165p positioned on the semiconductor layer 154p, a source electrode 173p positioned on the ohmic contact member 163p, and a drain electrode 175p spaced apart from the source electrode 173p on the ohmic contact member 165p.

The lower display panel 100 may further include a gate line positioned on the lower substrate 110, and a data line crossing the gate line. Herein, the gate line may be connected with the gate electrode 124p of the pixel transistor TrP. In addition, the data line may be connected with the source electrode 173p of the pixel transistor TrP.

The lower display panel 100 may further include a passivation layer 180 covering the pixel transistor TrP, a color filter 230 positioned on the passivation layer 180, an overcoat 250 positioned on the color filter 230, and a pixel electrode 191 positioned on the overcoat 250. Herein, the pixel electrode 191 may be connected with the drain electrode 175p of the pixel transistor TrP through a contact hole 185 that extends through the overcoat 250 and the passivation layer 180.

Any one of the readout transistors TrC1 and TrC2 of the upper display panel is preferably overlapped with the transistor TrP of the lower display panel.

The upper display panel 200 includes a common electrode 270 facing the pixel electrode 191. Here, the common electrode is formed on the same substrate surface as the transistors of the upper display panel, but may alternatively be formed on an opposite surface thereto. An electric field is formed between the common electrode 270 and the pixel electrode 191, and aligns the liquid crystal molecules of the liquid crystal layer 3.

In FIG. 5, the transistor of the upper display panel faces downward and the transistor of the lower display panel faces upward, such that both transistors face each other. Alternatively, the transistor of the upper display panel may also face upward like the transistor of the lower display panel. In this case, the common electrode may be formed (not shown) on an opposite surface of the upper display panel where no transistor is formed, i.e., a substrate surface facing the lower display panel.

Hereinafter, a method for forming the IR sensing transistor and the readout transistor of the touch panel described above will be described in detail with reference to FIGS. 6 to 10.

FIGS. 6 to 10 are cross-sectional views taken along line III-III of FIG. 2 at different points in a process sequence, in order to describe a method of forming an IR sensing transistor and a readout transistor according to an exemplary embodiment of the present invention.

Figure 6:
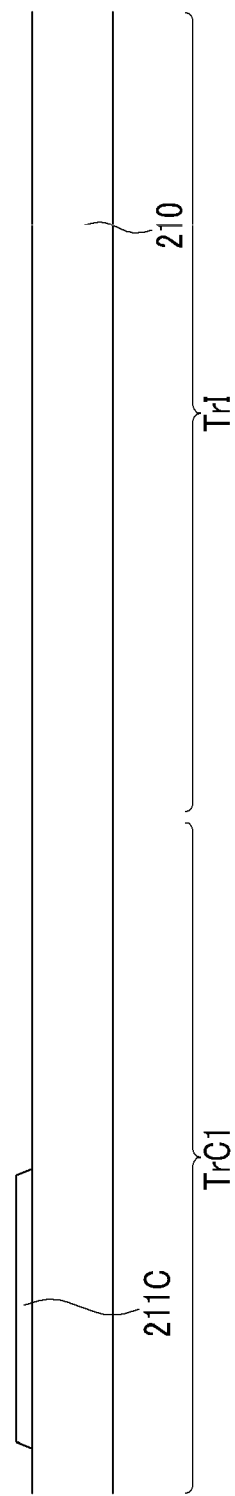
FIGS. 6 to 10 are cross-sectional views taken along line III-III of FIG. 2 as cross-sectional views showing a process sequence in order to describe a method of forming an IR sensing transistor and a readout transistor according to an exemplary embodiment of the present invention.

First, as shown in FIG. 6, a lower gate electrode 211C of the readout transistor TrC1 is formed on a substrate 210 that is made of transparent glass or plastic. The lower gate electrode 211C may be made of molybdenum, aluminum, or the like, and may be formed of multiple such as molybdenum/aluminum, or molybdenum/aluminum/molybdenum.

Figure 7:
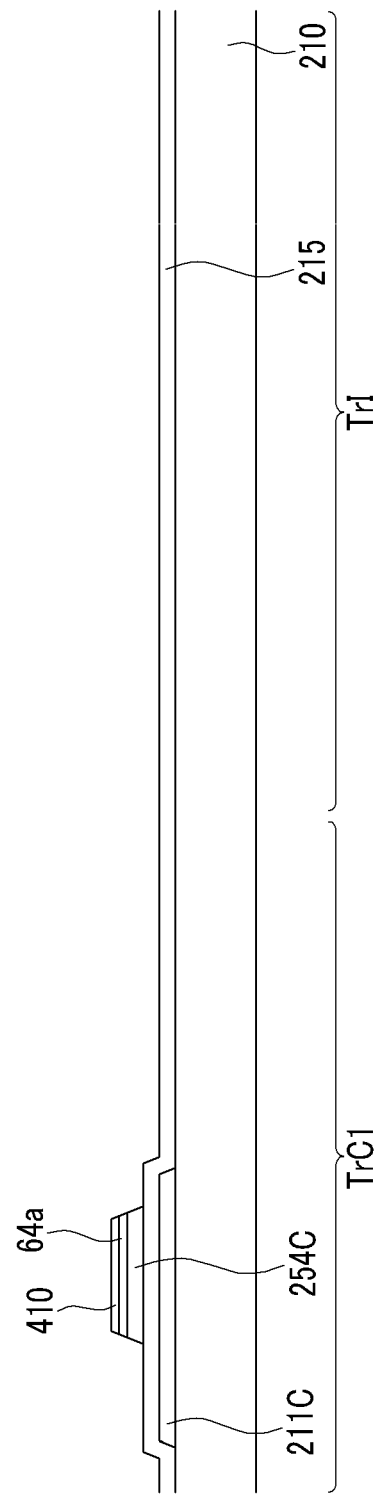

Next, as shown in FIG. 7, a blocking insulation layer 215, made of an insulation material such as silicon nitride, is formed on the substrate 210. The blocking insulation layer 215 has a thickness of about 3000 to about 10000 Å.

Thereafter, a semiconductor 254C of the readout transistor, a first ohmic contact pattern 64a, and an anti-etching pattern 410 are formed by laminating and patterning an amorphous silicon layer, a silicon layer including conductive impurities, and an etching stopping layer respectively on the blocking insulation layer 215.

Figure 8:
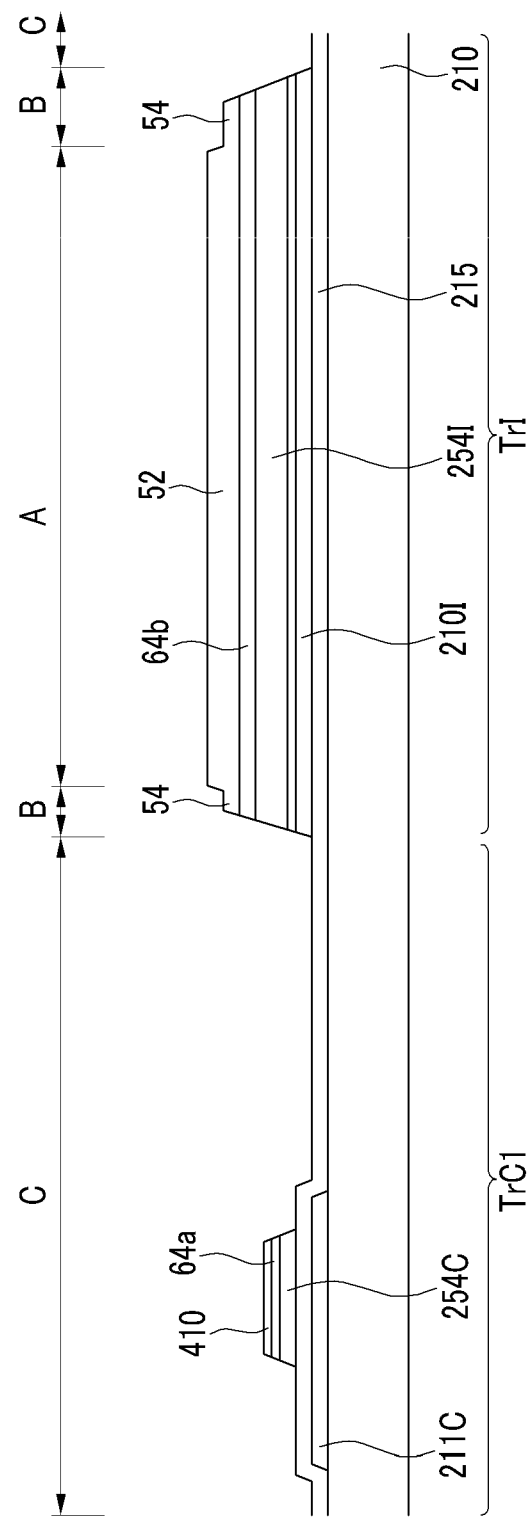

Next, as shown in FIG. 8, a blocking layer, a silicon nitride layer, a first silicon layer, and a second silicon layer are formed. The blocking layer is made of a material through which may pass only infrared rays. The first silicon layer is made of amorphous silicon including germanium, and the second silicon layer is formed as an amorphous silicon layer doped with conductive impurities.

Thereafter, photosensitive layer patterns 52 and 54 having different thicknesses are formed on the second silicon layer.

In the photosensitive layer patterns 52 and 54, a portion on which the semiconductor will be formed is referred to as a first part A, a portion where the semiconductor will not be formed is referred to as a second part B, and an area other than the first part A and the second part B is referred to as a third part C.

Between the photosensitive layer patterns 52 and 54, the photosensitive layer 52 positioned in the first part A is thicker than the photosensitive layer 54 positioned in the second part B, and the entirety of the photosensitive layer is removed in the third part C.

Accordingly, a photosensitive layer is formed with differing thicknesses at different positions. This layer can be formed in various ways. As an example, a transparent area, a light blocking area, and a semi-transparent area are provided in a lithography mask. A slit pattern, a lattice pattern, or a thin film having medium transmittance or a medium thickness is provided in a semi-transmissive area. A width of a slit or a gap between slits is preferably smaller than the resolution of an exposer used in a lithography process at the time of using the slit pattern. As another example, a photosensitive layer which can reflow is used. That is, the reflowable photosensitive layer pattern is formed and reflowed by a general mask having only the transparent area and the light blocking area, to flow to an area where the photosensitive layer does not remain, so as to form a thin part.

Thereafter, a second silicon pattern 4, a first silicon pattern 2, an insulation layer 240, and a light blocking layer 210I are formed by etching the second silicon layer, the first silicon layer, the silicon nitride layer, and the blocking layer by using the photosensitive layer patterns 52 and 54 as a mask and the photosensitive layer of the third part C as a mask.

Figure 9:
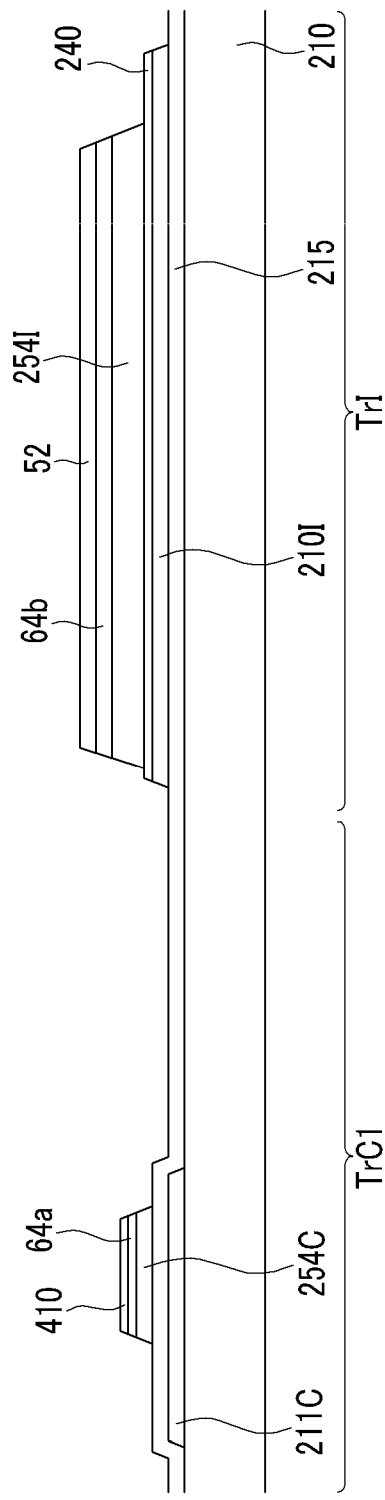

Next, as shown in FIG. 9, a second ohmic contact pattern 64b and a semiconductor 254I are formed by removing the photosensitive layer pattern of the second part B and etching the second silicon pattern and the first silicon pattern by using the photosensitive layer pattern 52 of the first part A as a mask. Thereafter, the anti-etching layer is removed. Alternatively, the anti-etching layer may remain, as described in the exemplary embodiment of FIG. 3.

Figure 10:
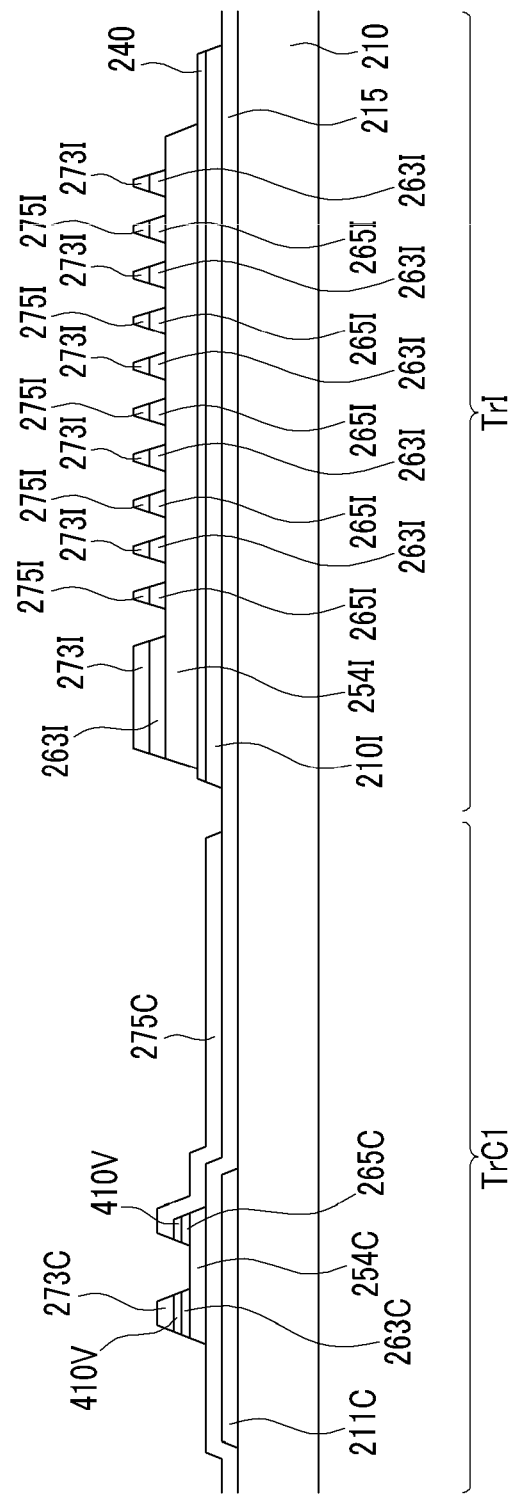

Next, as shown in FIG. 10, the source electrode 273C and the drain electrode 275C of the readout transistor, and the source electrode 273V and the drain electrode 275I of the IR sensing transistor are formed by removing the photosensitive layer pattern of the first part, and forming and patterning a metal layer on the substrate 210.

Next, as shown in FIG. 3, contact holes 225c, 225I, 288C, and 288I are formed by forming and etching the passivation layer 280 on the substrate 210. In addition, an upper gate electrode 224C of the readout transistor and a gate electrode 224I and a connection member 24 of the IR sensing transistor are formed by forming and patterning the metal layer on the passivation layer 280.

Thereafter, the insulation layer 290 is formed.

As described above, in the exemplary embodiment of the present invention, since the light blocking layer, the insulation layer, and the semiconductor are formed after laminating the blocking layer, the silicon nitride layer, and the first silicon layer, the surface of the insulation layer which becomes the gate insulating layer of the IR sensing transistor is not exposed, thereby acquiring better interface characteristics.

In addition, since both the light blocking layer and the semiconductor are formed in the same process, it is possible to prevent a misalignment which may be generated by forming the light blocking layer and the semiconductor in separate processes.

Figure 11:
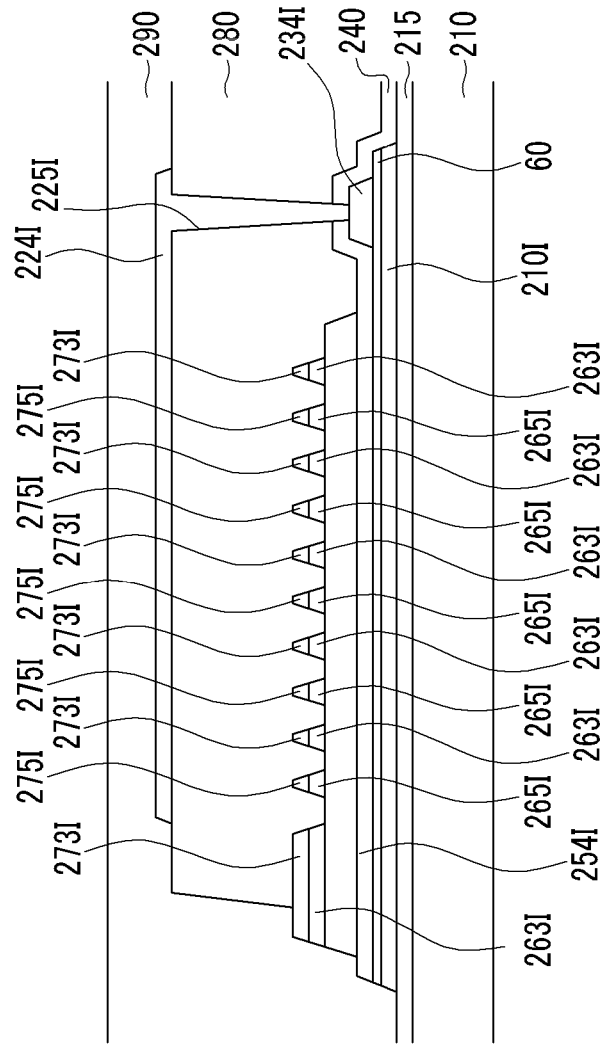
FIG. 11 is a cross-sectional view of an IR sensing transistor of a touch panel according to another exemplary embodiment of the present invention.

FIG. 11 is a cross-sectional view of an IR sensing transistor of a touch panel according to another exemplary embodiment of the present invention.

Since most interlayer configurations are the same as those of the IR sensing transistor shown in FIG. 3, only elements that differ will be described. The same reference numerals as those of FIG. 3 refer to the same parts.

Unlike the light blocking layer of FIG. 3, the light blocking layer of the IR sensing transistor shown in FIG. 11 further includes a conductive layer 60 positioned on the light blocking layer 210I, and a lower gate electrode 234I positioned on the conductive layer 60.

The conductive layer 60 is made of a metal which can be etched together with the light blocking layer, such as molybdenum, titanium, or a mixed metal including both.

The conductive layer 60 may have a thickness in the range of about 50 to about 100 Å. That is, it is preferable that the conductive layer 60 has a thickness of about 100 Å or less, so as to block visible rays and pass infrared rays, and a thickness of about 50 Å or more to reduce resistance.

Accordingly, the thickness of the light blocking layer 210I shown in FIG. 11 is smaller than those of the light blocking layer 210I of FIG. 3 by the thickness of the conductive layer 60.

When the light blocking layer 210I including germanium is in direct contact with the upper gate electrode 224I, a contact resistance increases so as to apply a voltage to the light blocking layer 210I that is different from a voltage of the upper gate electrode 224I. However, when the lower gate electrode 234I and the conductive layer 60 are formed as described in the exemplary embodiment of the present invention, the upper gate electrode 224I and the lower gate electrode 234I are connected by the same conductor. The resistance between the lower gate electrode 234I and the light blocking layer 210I is decreased due to the conductive layer 60, and as a result, the same signal may be applied to the light blocking layer 210I as is applied to the upper gate electrode 224I.

Meanwhile, as another embodiment of the present invention, the light blocking layer of the IR sensing transistor may include conductive impurities.

The conductive impurities may be phosphorus (P), and may be doped to only the top of the light blocking layer 210I or doped to the entirety of the light blocking layer 210I. The conductive impurities may be formed by adding $PH_3$ at the time of forming the light blocking layer 210I, where $PH_3$ is injected such that $PH_3/(SiH_4+GeH_4)$ is about 5 vol % to about 500 vol %.

When $PH_3$ is doped to only the top of the light blocking layer 210I, the thickness of the doped part is preferably about 5% or more of the entire thickness of the light blocking layer (doping to a lower thickness risks not sufficiently reducing the contact resistance between the lower gate electrode and the light blocking layer).

When the conductive impurities are doped to the light blocking layer 210I as described in the exemplary embodiment, it is possible to reduce the contact resistance between the lower gate electrode 234I and the light blocking layer 210I.

Further, it is possible to reduce the transmittance of the visible rays. This is described in further detail with reference to FIGS. 12 and 13.

Figure 12:
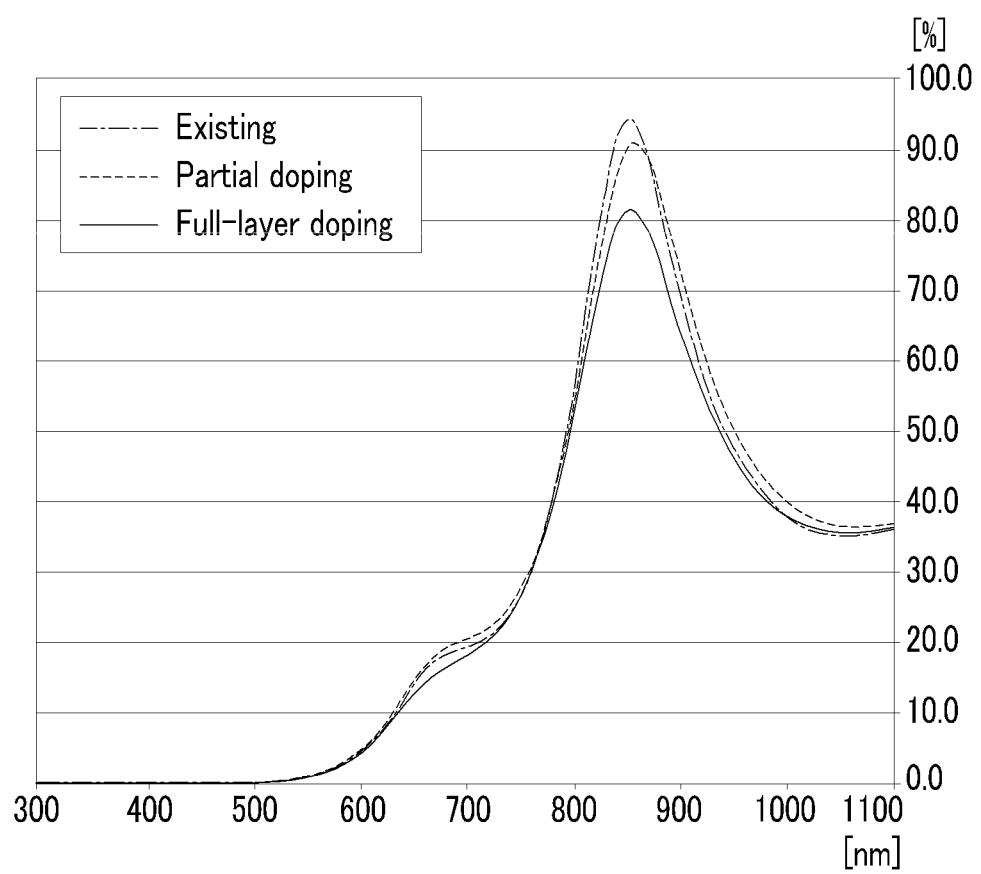
FIG. 12 is a graph illustrating transmittance characteristics depending on doping conductive impurities onto a light blocking layer.

FIG. 12 is a graph illustrating transmittance characteristics of various conductive impurities doped into a light blocking layer.

Herein, the solid line illustrates a transmittance graph of a light blocking layer not doped with conductive impurities (hereinafter, referred to as a first exemplary embodiment), the dashed line illustrates a transmittance graph of a light blocking layer of which only a part is doped with the conductive impurities (hereinafter, referred to as a second exemplary embodiment), and the dashed-and-dotted line illustrates a graph in which the entire light blocking layer is doped with the conductive impurities (hereinafter, referred to as a third exemplary embodiment).

In this case, the thickness of the entire light blocking layer is approximately 2000 Å. In the second exemplary embodiment, the thickness of the light blocking layer not including the conductive impurities is approximately 1700 Å, and the thickness of the light blocking layer including the conductive impurities is approximately 300 Å.

Referring to FIG. 12, the transmittance is reduced in the third exemplary embodiment as compared to the first exemplary embodiment. However, it can be seen that the transmittance is also reduced in the visible-ray area of 650 to 700 nm.

As such, when the conductive impurities are doped as described in the exemplary embodiment of the present invention, the transmittance in the visible-ray area is reduced so as to effectively prevent visible rays from being incident upon the IR transistor.

Figure 13:
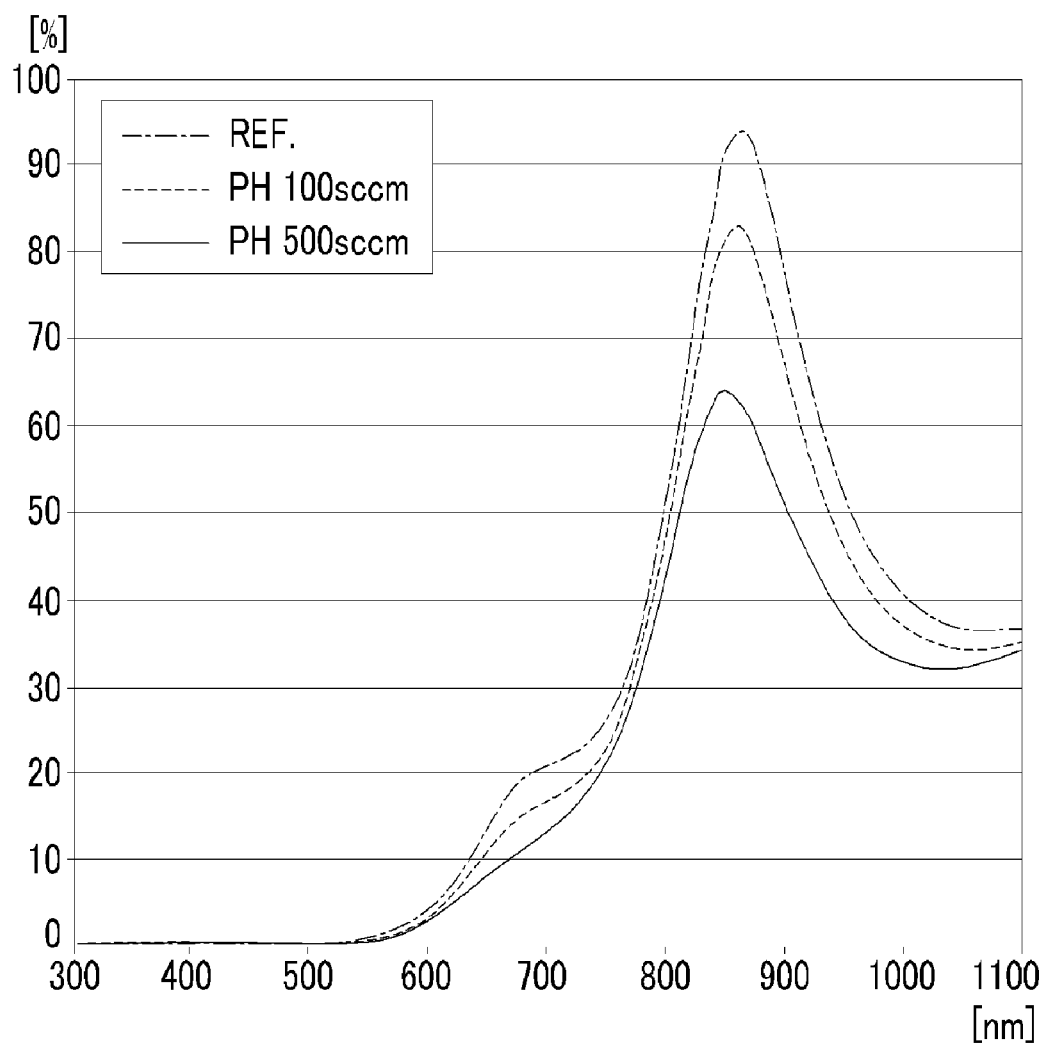
FIG. 13 is a graph illustrating transmittance variation depending on the doping amount of conductive impurities.

FIG. 13 is a graph illustrating transmittance variation depending on the doping amount of conductive impurities.

Referring to FIG. 13, it can be seen that the transmittance of a light blocking layer formed by inputting conductive impurities $PH_3$ of 100 sccm is reduced in the visible-ray area, as compared with a light blocking layer not doped with these conductive impurities. In addition, it can be seen that when the conductive impurities $PH_3$ are increased to 500 sccm, the transmittance of the light blocking layer formed by inputting 100 sccm is further reduced in the visible-ray area.

Accordingly, when the light blocking layer is formed by doping the conductive impurities as described in the exemplary embodiment of the present invention, the transmittance in the visible-ray area is reduced so as to effectively prevent the visible rays from being incident to the IR transistor.

While this invention has been described in connection with what is presently considered to be practical exemplary embodiments, it is to be understood that the invention is not limited to the disclosed embodiments. Further, the protection scope of the present invention may be extended to a scope which is technologically equivalent to the appended claims.

<Description of symbols>

| | |
|---|---|
| 2: First silicon pattern | 3: Liquid crystal layer |
| 4: Second silicon pattern | 24: Connection member |
| 52, 54: Photosensitive layer pattern | 64a, 64b: Ohmic contact pattern |
| 100: Lower display panel | 110, 210: substrate |
| 124p: Gate electrode | 140: Gate insulating layer |
| 154p, 254C, 254V, 254I: Semiconductor | |
| 163p, 165P, 263C, 265C, 263I, 265I, 263V, 265V: Ohmic contact member | |
| 173p, 273C, 273I, 273V: Source electrode | |
| 175p, 275C, 275I, 275V: Drain electrode | |
| 180, 280: Passivation layer | |
| 33, 185, 225C, 225I, 228C, 228I: Contact hole | |
| 191: Pixel electrode | 200: Upper display panel |
| 210I: Light blocking layer | 211C, 254C: Lower gate electrode |
| 215: Blocking insulation layer | 221: Second signal line, |
| 224C: Upper gate electrode | 224V: Gate electrode |
| 230: Color filter | 233: Storage electrode |
| 234I: Lower gate electrode | |
| 240, 290: Insulation layer | 250: Overcoat |
| 270: Common electrode | 271: First signal line |
| 277: Conductor for capacitor | 410: Anti-etching pattern |
| 410V: Anti-etching layer | 910: Backlight unit |
| 920: IR luminous body | 930: Visible-ray luminous body |

What is claimed is:

1. An IR sensing transistor, comprising:
   a light blocking layer formed on a substrate and configured to act as a gate of the IR sensing transistor;
   a gate insulating layer formed on the light blocking layer;
   a semiconductor formed on the gate insulating layer;

a pair of ohmic contact members formed on the semiconductor;
a source electrode and a drain electrode formed on respective ones of the ohmic contact members;
a passivation layer formed on the source electrode and the drain electrode; and
a gate electrode formed on the passivation layer,
wherein substantially all of the gate insulating layer lies on the light blocking layer.

2. The IR sensing transistor of claim 1, wherein:
the source electrode and the drain electrode are positioned within an outer edge of the light blocking layer.

3. The IR sensing transistor of claim 2, wherein:
the source electrode and the drain electrode both at least partially overlap the gate electrode, and at least two source electrodes are disposed in alternating manner with at least two drain electrodes.

4. The IR sensing transistor of claim 1, wherein:
the gate electrode and the light blocking layer are connected through contact holes formed in the passivation layer and the gate insulating layer.

5. The IR sensing transistor of claim 4, wherein:
the semiconductor comprises amorphous silicon, microcrystalline amorphous silicon germanium, or amorphous germanium.

6. The IR sensing transistor of claim 5, wherein:
the light blocking layer comprises amorphous germanium or amorphous silicon germanium.

7. The IR sensing transistor of claim 1, further comprising:
a conductive layer positioned on the light blocking layer; and
a lower gate electrode positioned on the conductive layer.

8. The IR sensing transistor of claim 7, wherein:
the conductive layer includes at least one of titanium, molybdenum, a titanium compound, and a molybdenum compound.

9. The IR sensing transistor of claim 8, wherein:
the conductive layer has a thickness in the range of about 50 to about 100 Å.

10. The IR sensing transistor of claim 1, further comprising:
a lower gate electrode positioned on the light blocking layer,
wherein conductive impurities are doped into the light blocking layer.

11. The IR sensing transistor of claim 10, wherein:
a thickness of the light blocking layer is about 300 Å or more.

12. The IR sensing transistor of claim 11, wherein:
the conductive impurities comprise phosphorus.

* * * * *